(12) United States Patent
Basol (10) Patent No.: US 7,101,471 B2
(45) Date of Patent: Sep. 5, 2006

(54) METHOD FOR PLANAR MATERIAL REMOVAL TECHNIQUE USING MULTI-PHASE PROCESS ENVIRONMENT

(75) Inventor: Erol C. Basol, Manhattan Beach, CA (US)

(73) Assignee: ASM Nutool, Inc., Phoenix, AZ (US)

( * ) Notice: Subject to any disclaimer, the term of this patent is extended or adjusted under 35 U.S.C. 154(b) by 289 days.

(21) Appl. No.: 10/383,466

(22) Filed: Mar. 6, 2003

(65) Prior Publication Data

US 2003/0168351 A1 Sep. 11, 2003

Related U.S. Application Data

(60) Provisional application No. 60/362,513, filed on Mar. 6, 2002.

(51) Int. Cl.
*B23H 3/00* (2006.01)
*B23H 7/26* (2006.01)

(52) U.S. Cl. ............... 205/640; 205/662; 205/663; 205/674; 205/686; 204/224 M; 204/224 R; 451/113; 451/162

(58) Field of Classification Search ........... 205/668, 205/662–663, 640, 123, 674, 686; 204/224 M, 204/224 R; 451/113, 162
See application file for complete search history.

(56) References Cited

U.S. PATENT DOCUMENTS 6,315,883 B1 11/2001 Mayer et al.
6,811,680 B1 * 11/2004 Chen et al. ................. 205/662
2005/0150777 A1 * 7/2005 Basol ......................... 205/668

* cited by examiner

*Primary Examiner*—Roy King
*Assistant Examiner*—Lois Zheng
(74) *Attorney, Agent, or Firm*—Knobbe, Martens, Olson & Bear, LLP (57) ABSTRACT

An electroetching process of the present invention uses a multiphase environment for planarizing a wafer with conductive surface having a non-uniform topography. The multiphase environment includes a high resistance phase and an etching solution phase. The conductive surface to be planarized is placed in the high resistance phase and adjacent a phase interface between the high resistance phase and the etching solution phase. A wiper is used to mechanically move the thin high resistance phase covering the conductive surface so that the raised regions of the non-planar conductive surface is briefly exposed to etching solution phase. The mechanical action of the wiper does not disturb the high resistivity phase filling the rescessed regions of the surface. As the raised surface locations are exposed, the etching solution phase contacts and electroetch the exposed regions of the raised regions until the surface planarized.

36 Claims, 11 Drawing Sheets

METHOD FOR PLANAR MATERIAL REMOVAL TECHNIQUE USING MULTI-PHASE PROCESS ENVIRONMENT

RELATED APPLICATIONS

This application claims priority from the Provisional Application Ser. No. 60/362,513 filed Mar. 6, 2002, (NT-240 P) which is incorporated herein by reference.

FIELD

The present invention relates to manufacture of semiconductor integrated circuits and, more particularly to a method for planar electroetching or etching of conductive layers.

BACKGROUND

Conventional semiconductor devices generally include a semiconductor substrate, usually a silicon substrate, and a plurality of sequentially formed dielectric interlayers such as silicon dioxide and conductive paths or interconnects made of conductive materials. Copper and copper alloys have recently received considerable attention as interconnect materials because of their superior electromigration and low resistivity characteristics. The interconnects are usually formed by filling copper by a deposition process in features or cavities etched into the dielectric interlayers. Although Physical Vapor Deposition (PVD) and Chemical Vapor Deposition (CVD) techniques may also be used, the preferred method of copper deposition process is electroplating. In an integrated circuit, multiple levels of interconnect networks laterally extend with respect to the substrate surface. Interconnects formed in sequential interlayers can be electrically connected using vias or contacts.

In a typical process, first an insulating dielectric interlayer is formed on the semiconductor substrate. Patterning and etching processes are performed to form features such as trenches and vias in the insulating layer. Then, copper is electroplated to fill all the features. However, the plating process results in a thick copper layer on the substrate some of which need to be removed before the subsequent step. Conventionally, after the copper plating, CMP process is employed to planarize and then reduce the thickness of the copper layer down to the level of the surface of the barrier or insulation layer. In summary, CMP is used to remove all of the conductors from the surface so that copper-filled features electrically isolated from one another. However, CMP process is a costly and time-consuming process that reduces production efficiency. Further, more, although the CMP can be used with the conventional interlayer dielectrics, it may create problems with low-k dielectrics because of the mechanical force applied on the wafer surface during the CMP process. During the CMP step, the low-k materials may be stressed and may delaminate or other defects may form due to the low mechanical strength of the low-k materials.

Another material removal technique involves well-known electropolishing processes. In the electropolishing, which may also be referred to as "electrochemical etching" or "electroetching," both the material to be removed and a conductive electrode are dipped into the electro-polishing solution. Typically an anodic (positive) voltage is applied to the material to be removed with respect to the conductive electrode. With the applied voltage, the material is electrochemically dissolved and removed from the wafer surface. However, this technology has a limited use in planarizing non-flat and non-uniform overburden copper layers because, during electroetching, material removal generally progresses in a conformal manner. Conformal nature of the process produces dishing defects in large features with small aspect ratios, which adversely affect wire dimensions.

Figure 1A:
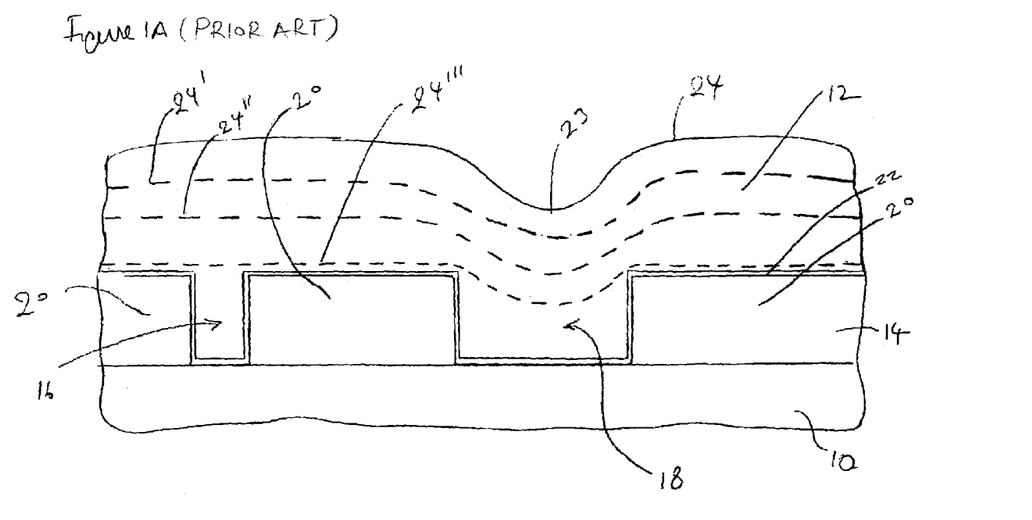
FIG. 1A is a schematic illustration of a wafer surface having a non uniform copper overburden on top of it.
Figure 1B:
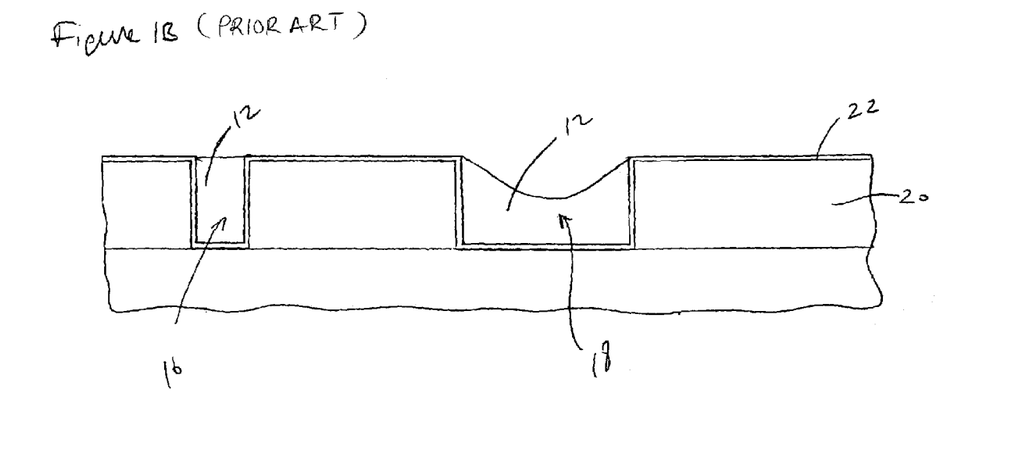
FIG. 1B is a schematic illustration of the wafer surface shown in FIG. 1A, wherein the copper overburden is planarized using a prior art process.

This situation can be demonstrated with help of FIGS. 1A–1B. FIG. 1A illustrates a substrate 10 coated with a copper layer 12, having an overburden to be removed. The substrate is a preprocessed silicon wafer having an insulation layer 14 on top it. The insulation layer 14 is patterned and etched to form features 16, 18 such as trenches and field regions 20. FIG. 1A illustrates a narrow trench 16 with an aspect ratio of greater than 1 and a wide trench 18 with an aspect ratio of less than 1. By aspect ratio, it is meant a ratio of the depth of the trench to the width of the trench. Before the copper plating, the features 16, 18 and the field regions 20 are lined with a barrier layer 22 (such as Ta/TaN) and a copper seed layer (not shown). Conventional electrodeposition processes may fill the narrow features 16 in a bottom-up fashion by utilizing additives in electroplating baths and thus yield a flat surface as shown in FIG. 1A. However, copper deposits conformally over the large features 18 and produces recess 23 over such features. As mentioned above, electroetching of the copper layer 12 also progresses conformally during the standard electroetching process. As shown in FIG. 1A, as the etching of the copper layer progresses, the top surface 24 of the copper layer 12 gradually approaches the features 16, 18. This situation is shown by dotted lines 24', 24" and 24'". When the etched surface 24'" is reached, some copper is still on the field regions but the copper in large feature is over etched. As shown in FIG. 1B, as the remaining copper on the field regions is etched away, copper in the large feature 18 is dished because of excessive removal. The large feature in this example may be a trench with a width larger than 10 micrometers.

Dishing problems originating from the conformal nature of the electroetching process may be alleviated by utilizing methods that partially planarize the overburden layer employing, for example, CMP or another planarization technique prior to the electroetching step. In such approaches, once the overburden is made flat, resulting flat surface is uniformly etched back down to the barrier layer. However, such multi-process approaches are cumbersome and time consuming. Besides, success of such processes strictly depends on the thickness uniformity of the flat layer that the electroetching process is initiated on. If the flat copper layer has slight local or global thickness non-uniformities, i.e., thinner and thicker areas, the features under the thinner copper layer are most likely dished while the thicker copper layer is still being removed from other thicker areas on the wafer. Such thickness non-uniformities can be the result of various reasons such as copper plating tool design, plating chemistry problems, problems with electrical contact to the wafer, plating solution problems, and the like. Alternately, there may be non-uniformities in the electro etching process itself that may cause non-uniform material removal from various parts of the substrate.

Figure 2A:
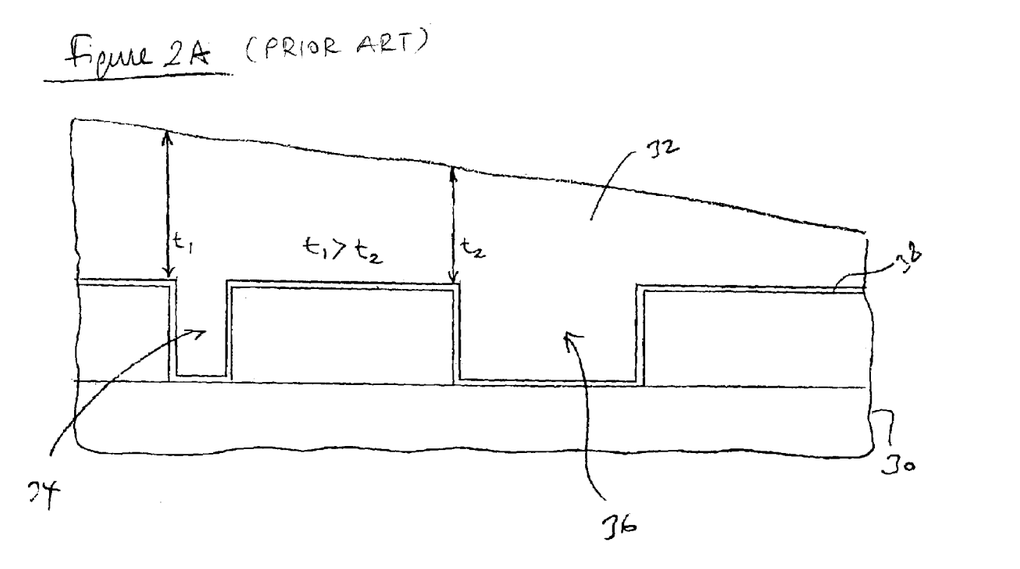
FIG. 2A is a schematic illustration of a wafer surface having a copper overburden with non-uniform thickness.
Figure 2B:
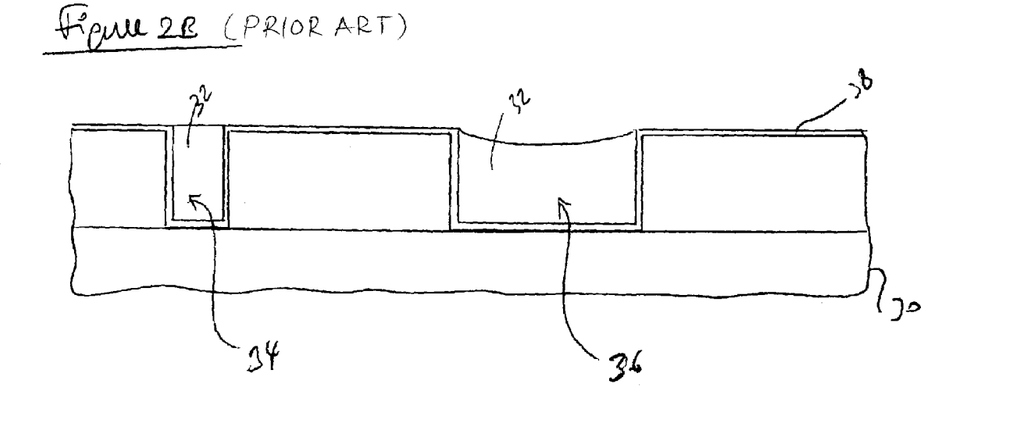
FIG. 2B is a schematic illustration of the wafer surface shown in FIG. 2A, wherein the copper overburden is planarized using a prior art process.
Figure 2C:
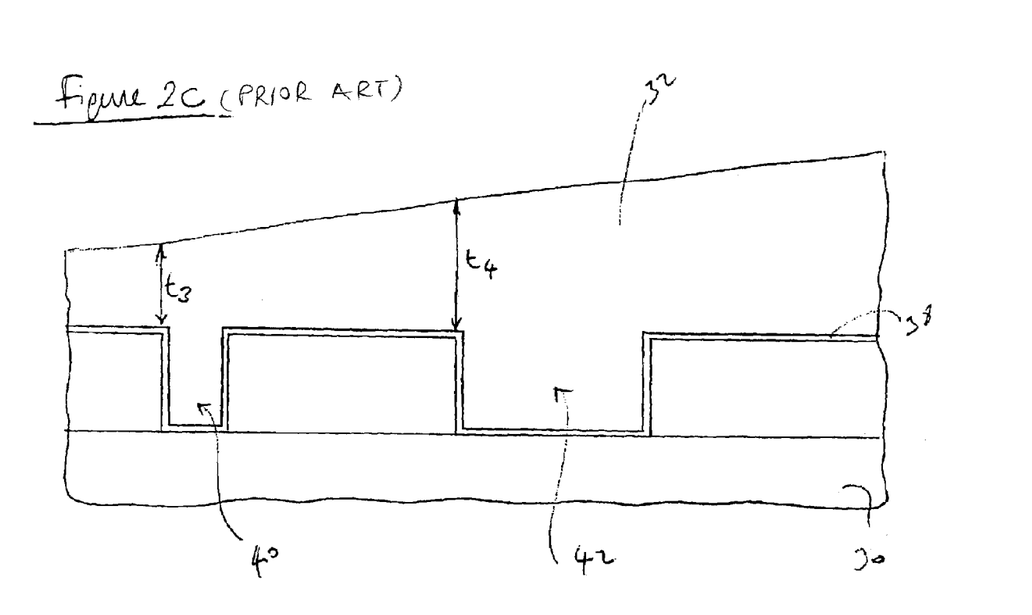
FIG. 2C is a schematic illustration of another wafer surface having a copper overburden with non-uniform thickness
Figure 2D:
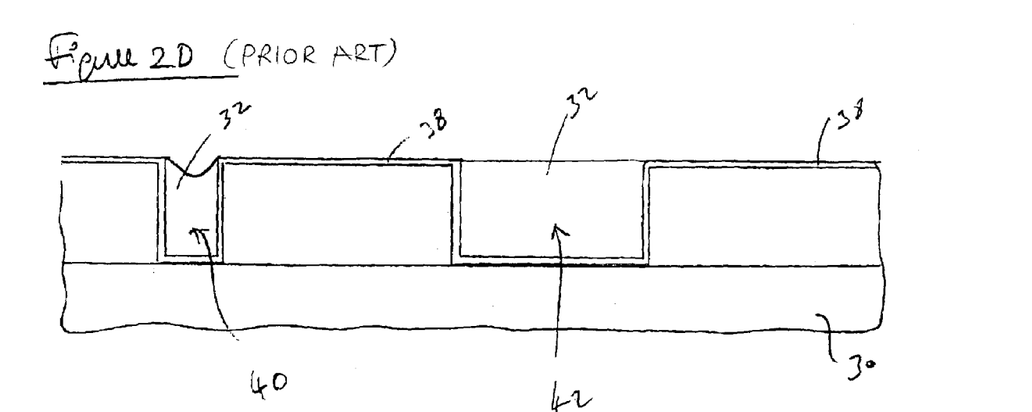
FIG. 2D is a schematic illustration of the wafer shown in FIG. 2C, wherein the copper overburden is planarized using a prior art process.

FIG. 2A illustrates a region of a substrate 30 having a copper layer 32 that is partially planarized and has thickness non-uniformity, which is exaggerated to clarify the point. In this example, $t_1$ is the measured thickness taken near a first feature 34 and $t_2$ is the measured thickness taken near a second feature 36. If $t_1$ is greater than $t_2$, as shown in FIG. 2B, the copper in the second feature 36 will be dished while the copper over the first feature 34 is planarized and leveled with the barrier layer 38. FIG. 2C shows another area on the substrate 30 where copper layer 32 is thinner with measured thickness $t_3$ near a third feature 40, but it is thicker with measured thickness $t_4$ near a fourth feature 42. As shown in FIG. 2D, in this case, removal of thin copper layer on the third feature is faster than the removal of the copper layer on the fourth feature 42. As a result, as the fourth feature 42 is planarized down to the level of barrier layer 38, the third feature 40 is dished. As described above, due to the thickness non-uniformities of the copper layer, conventional electroetching processes either over etch the copper in all of the features or over etch it in some of features while planarizing it in some features. A process that slows down or stops etching of the areas that begins to dish but accelerates etching of the un-etched areas would overcome above drawbacks.

Certain variations of electroetching process attempt to alleviate such process drawbacks. In one technique, for example, such recesses are filled or masked with a low ionic conductivity and low diffusivity material before the wafer is placed into the electroetching system. Use of such material coating on the wafer surface is claimed to slow down the etching of such recess areas during electroetching, and planarize the copper film.

To this end, however, there is need for alternative etching techniques that etch back even highly non-uniform conductive films with greater efficiency and those that do not cause excessive dishing into the features.

SUMMARY

The present invention uses an etching system utilizing a multi phase process environment in combination with a surface disturbance on the substrate surface.

An applied surface disturbance such as a sweeping action moves a high resistance solution component of a multiphase solution from surface of a overburden copper instantaneously at the location of the surface disturbance and enables an electroetching solution phase component of the multiphase solution to act upon the substantially exposed surface of the overburden copper at that location. Once the rugged surface is electopolished, the electorpolishing process uniformly proceeds until the desired copper thickness is obtained.

DETAILED DESCRIPTION

The process of the present invention uses an etching system utilizing a multi phase process environment in combination with a mechanical influence on the substrate surface. In one preferred embodiment, multiphase process environment of the present invention is comprised of a dual phase process environment having a liquid phase and a near-surface phase. The dual phase process environment of the present invention is comprised of a dual phase solution having a process solution phase (as the liquid phase) and a high resistance solution phase (as the near-surface phase). In another preferred embodiment, the dual phase process environment of the present invention is comprised of a process solution phase (as the liquid phase) and a near-surface phase comprising solid particles. In one preferred approach, the near-surface phase is comprised of solid particles surrounded by the same process solution that forms the process solution phase. Alternatively, in another approach, the near-surface phase is comprised of solid particles and a surface solution, which is different than the process solution. The dual phase solution may be comprised of an electroetching or electropolishing solution forming the process solution phase and a near-surface solution phase, which is comprised of a high resistance solution. It is understood that the nature of the process solution phase depends strictly on the process that is used. As in the present embodiment if the process is an electrochemical process, the process solution phase comprises an electroetching or electropolishing solution such as phosphoric acid solution. However, if a chemical etching process is considered a conventional copper etching solution such as solutions containing $H_2SO_4$ and $H_2O_2$ can be used. From here on, to describe the invention, concentration will be on the case where the process solution is an electroetching solution. In this embodiment, the near-surface solution phase is a high resistance solution, which is denser or lighter than the electroetching solution and does not substantially interact with the electroetching solution. In other words, the high resistance solution and the electroetching solution do not substantially mix, dissolve in each other, or chemically react with each other. As a result the solutions substantially stay in their distinct phases such that the high resistance solution forms a separate phase either under or on top of the electroetching solution. During the process, the high resistance solution covers the rugged or non-planar surface of the overburden copper and isolates the electroetching solution from the overburden copper.

An applied surface disturbance such as a sweeping action moves the high resistance solution from the surface of the overburden copper instantaneously at the location of the surface disturbance and enables electroetching solution to act upon the substantially exposed surface of the overburden copper at that location. As the process progresses, initially upper most bumps, or thicker areas, on the copper layer are exposed to the electroetching solution because the sweeper can only touch them. For a wafer with copper layer facing up, during the electrochemical removal of the thicker areas, thinner areas (valleys) on the rugged upper surface are covered with the high resistance solution and as a result they are not removed. Once the rugged surface is planarized, the removal process uniformly proceeds until the desired copper thickness is obtained.

In this embodiment, it should be noted that a source of a mechanical disturbance such as a solution wiper should be placed above the surface of the wafer to be processed. This setup is used for the case of employing a high resistance solution that has a higher density than the electroetching solution. If the high resistance solution is lighter than the electroetching solution, a configuration that places the wafer over the sweeper can be used.

Figure 3A:
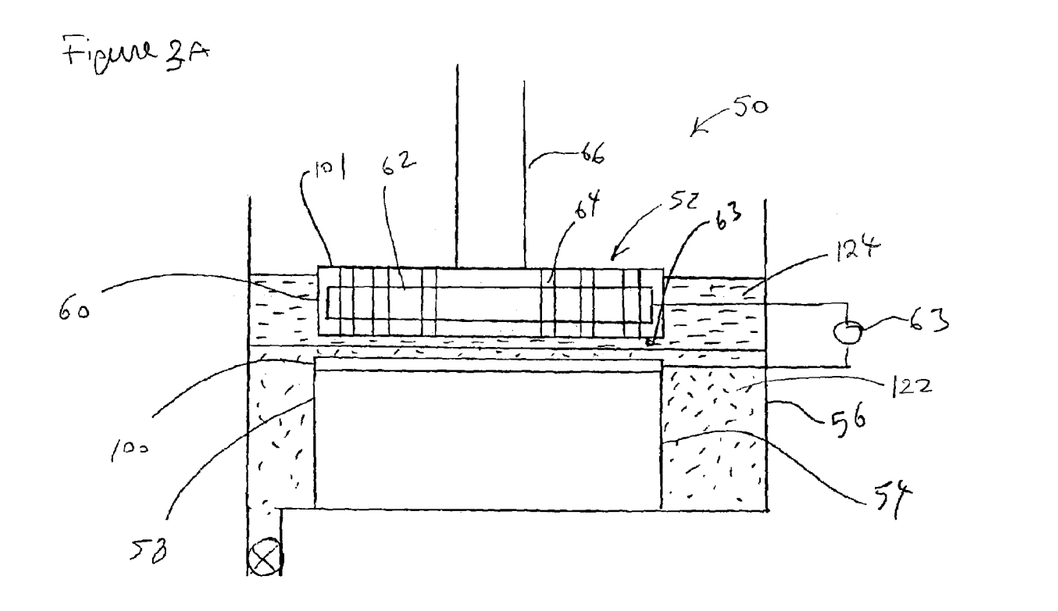
FIG. 3A is a schematic illustration of an exemplary multiphase etching system of the present invention.
Figure 3B:
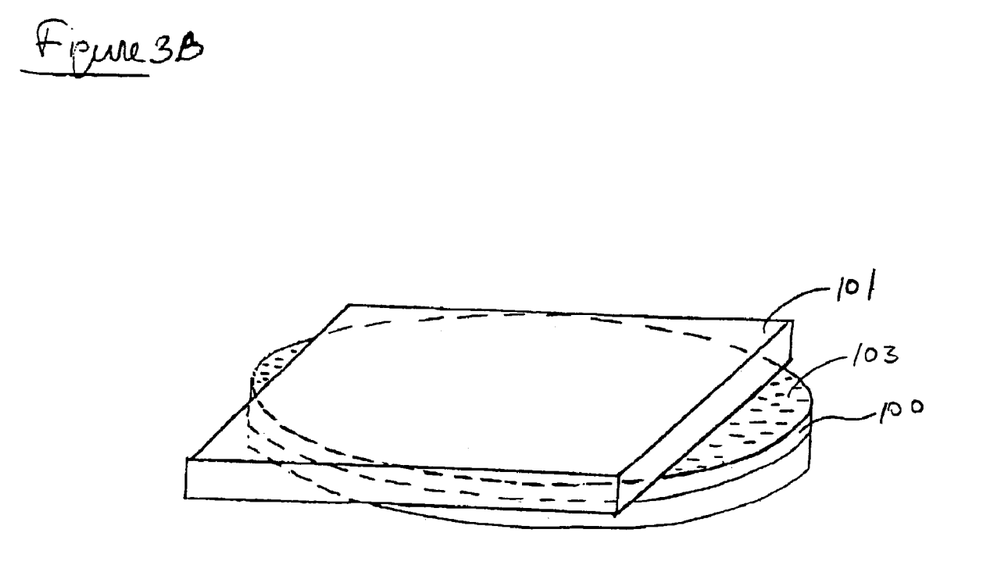
FIG. 3B is a schematic illustration of the relative positions of a wafer and a solution wiper of the system shown in FIG. 3A.

Reference will now be made to the drawings wherein like numerals refer to like parts throughout. FIG. 3A illustrates an exemplary etching system 50 comprising a solution wiper assembly 52 and a wafer holder assembly 54. Both assemblies 52, 54 are placed in a process container 56. The wafer holder assembly comprises a workpiece holder 58 to retain a workpiece 100. The sweeper assembly 52 comprises a body 60 having an electrode 62 and a solution wiper 101. FIG. 3B exemplifies the configuration of the workpiece 100 and the solution wiper 101 during the process of the present invention. Referring back to FIG. 3A, the solution wiper has a surface 63 that contacts the copper layer that is being planarized during the process. The electrode 62 may be placed in the solution wiper if the solution wiper is made of an isolating material and may be shaped as a plate with various shapes or a blade. A preferred material for the solution wiper may be made of a polymeric material with sufficient rigidity. In this embodiment the solution wiper is shaped as a rectangular plate, although it can be round or any other shape. Alternatively, the electrode 62 may be placed on top of the solution wiper 101 or any other place in the system as long as it makes physical contact with the electroetching solution. The electrode and the workpiece 100 are connected to the two terminals of a power supply 63.

The solution wiper includes a number of holes or pores 64 extending through, or extending to, the electrode so that electrode is in physical contact with the electroetching solution. The solution wiper 101 can be moved rotationally or laterally or both through a shaft 66 attached to the assembly 52 so as to perform the sweeping function on the workpiece 100. It should be noted that the same function could also be obtained by keeping the solution wiper stationary and moving the workpiece, or by moving both the wafer and the solution wiper. A dual phase solution 103 having two liquid phases is pooled in the container 56 through a solution delivery system (not shown) such that a first phase 122 covers the workpiece 100. Further, referring to FIG. 3A, a second phase 124 floats on the first phase 122. In this embodiment, the first phase is a high resistance solution and the second phase is an electroetching solution. The placement of the phases 122, 124 may be done sequentially or together.

Figure 4:
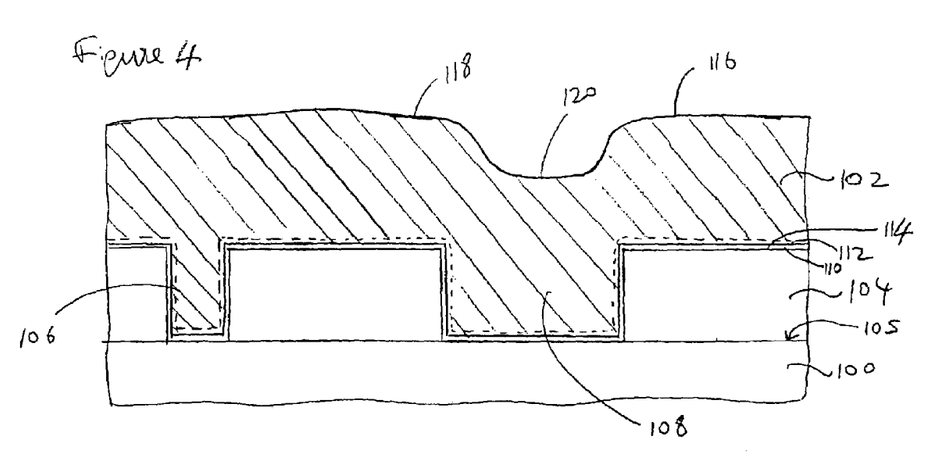
FIG. 4 is a schematic illustration of a wafer surface having a non uniform copper overburden on top of it.

FIG. 4 exemplifies the work piece 100 as a preprocessed silicon wafer having a conductive layer 102 on it. The conductive layer may be a copper layer that is deposited on the wafer 100 using for example an electroplating process, although it may be formed using any other method such as PVD, CVD or MOCVD. Preprocessing of the wafer 100 may include forming an insulation layer 104 on a top surface 105 of the wafer 100 and patterning and etching it to form features to be filled with copper. The features may be vias 106 with an aspect ratio of greater than 1 and trenches 108 with an aspect ratio of much less than 1. In one application, when filled with copper, such features form the wiring infrastructure of an integrated circuit. Conventionally, before the electroplating process, entire top exposed surface of the wafer is coated with a barrier layer 110 such as a Ta/TaN composite stack, and then a copper seed layer 112. For the sake of clarification, copper seed layer will not be included in the following figures. As a result, the features 106, 108 and top surface 114 of the insulation layer 104 (field regions 114) is coated with the barrier and seed layers 110, 112. Referring to FIG. 4, an upper surface 116 of the conductive layer 102 is a non-planar surface including raised regions 118 and recessed regions 120, or valleys, which will be removed and planarized with the present invention.

Figure 5:
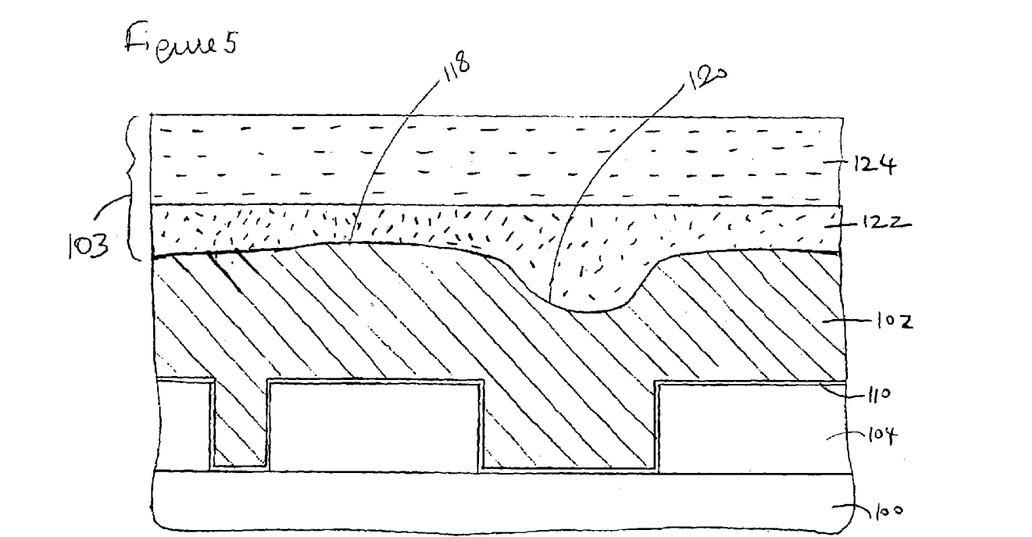
FIG. 5 is a schematic illustration of the wafer surface shown in FIG. 4, wherein the surface has been immersed in the dual phase etching environment of the system shown in FIG. 3A.

As illustrated in FIG. 5 when a predetermined amount of dual phase solution 103 is delivered into the system shown in FIG. 3A, the high resistance solution 122 covers the conductive layer 102 of the wafer 100 and the electroetching solution floats on top of the high resistance solution. It should be noted that by predetermining the amount of phases in the dual phase solution 103 and pre adjusting the height of the workpiece holder, the copper layer 102 is kept in the high resistance solution throughout the electroetching process. Obviously less high resistance solution could be used and invention could still be practiced as long as all the valleys were substantially filled with the high resistance solution. In this embodiment, the high resistance solution 122 is chosen to be denser than the electroetching solution 124. Of course, electrical conductivity of the high resistance solution is much smaller than that of the electroetching solution and the high resistance solution does not have the capability to etch or electroetch the copper layer. In this embodiment, the high resistance solution 122 can be delivered to the wafer surface either together with the electroetching solution 124 or they can be separately delivered from different sources.

The high resistance solution 122 fills the recessed regions 120 of the rugged terrain of the copper layer 102 and effectively protects them from electroetching solution 124 until the raised regions 118 are gradually flattened by exposing them to the electroetching solution 124 with the sweeping function of the solution wiper 101. Solution wiper sweeps the surface at a fixed elevation and the surface of the solution wiper moves in a plane that is substantially parallel to the surface of the wafer. During the process the solution wiper may be slightly pushed against the wafer with a force in the range of 0.1 to 1 psi. In a given instant, the solution wiper surface cannot touch the valley regions, and therefore cannot remove the high resistance solution from the valleys before touching the thicker regions and exposing them to the electroetching solution. Therefore, the electroetching process of the present invention is self-limiting, i.e., prevents etching of the thinner regions (valleys) before reducing the thickness of the thicker regions to the same thickness level that thinner regions have. As will be described below once the copper layer is made flat at one stage of the process, the process progresses by uniform removal of the copper layer.

Figure 6:
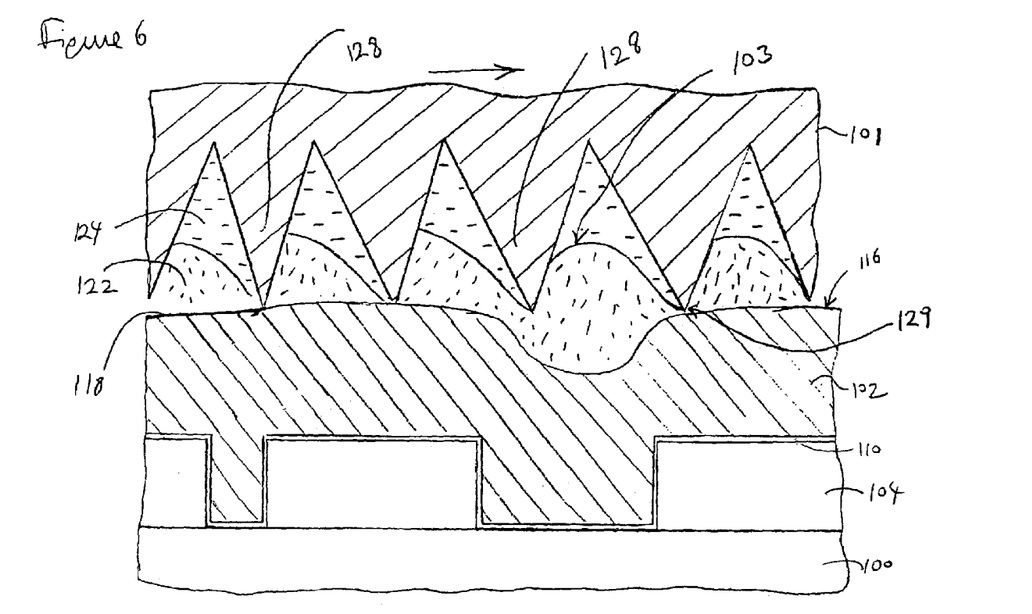
FIG. 6 is a schematic illustration of wafer surface shown in FIG. 5, wherein the surface has been electropolished in the dual phase environment and using a mechanical disturbance.

FIG. 6 illustrates the interaction between the solution wiper 101 and the surface 116 of the conductive layer 102. In this embodiment, surface 126 of the solution wiper 101 may have a number of sweeping features 128 to enhance the sweeping function of the solution wiper. In this embodiment, tips 129 of the features 128 are in the same plane so that the features do not sag into the recessed regions 120 on the surface 116 of the copper, and remove high resistance solution from the recessed regions. Specifically, as the features 128 of the solution wiper sweeps the surface 116 of the conductive layer 102, the high resistance solution 122 is instanteniously swept away from the surface 116 so that electroetching solution on top can reach an exposed portion of the surface 116 and etch the surface while an electroetching current is applied between the copper 102 and an electrode contacting the electroetching solution 101. During the process, the features 128 of the solution wiper are brought to close proximity of the conductive surface 116 and they may becontacted to the upper most end of the surface 116. Actual physical contact between the top surface of the wafer and the tips 129 may not be necessary to initiate electroetching at the top surface.

Figure 7:
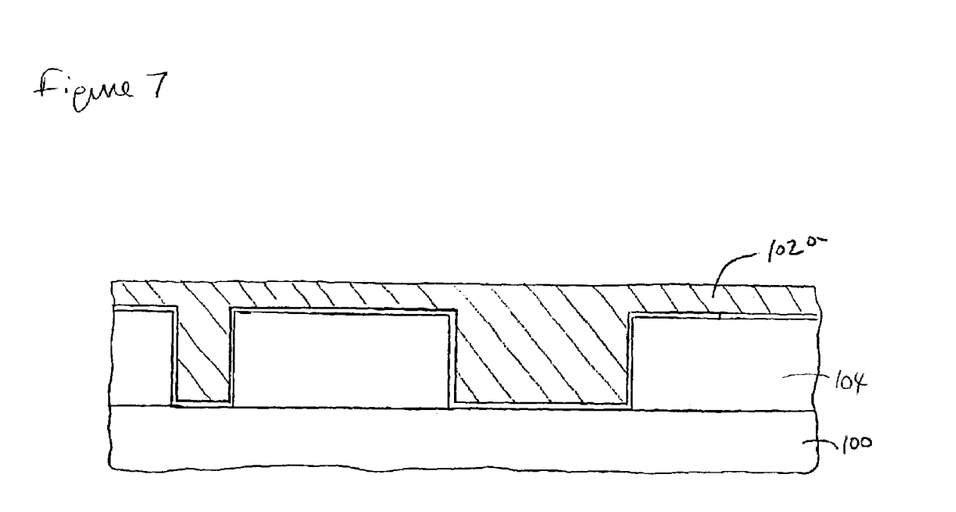
FIGS. 7 to 10 are schematic illustrations of the structures from the various stages of the electropolishing process of the present invention.

FIG. 7 shows an intermediate stage at the removal of the conductive layer 102, which can be an end-product of the process if so desired. As shown in FIG. 7, as the top of the conductive layer 102 is uniformly flattened and removed by the process, a planar conductive layer 102a is formed.

Figure 8:
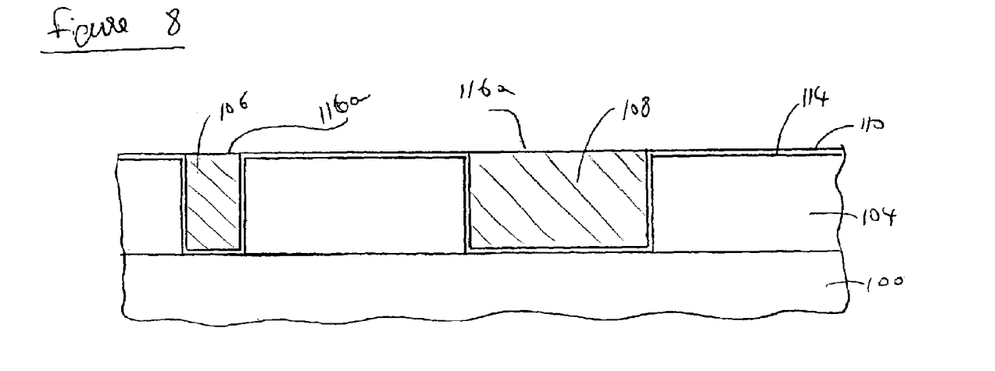
Figure 9:
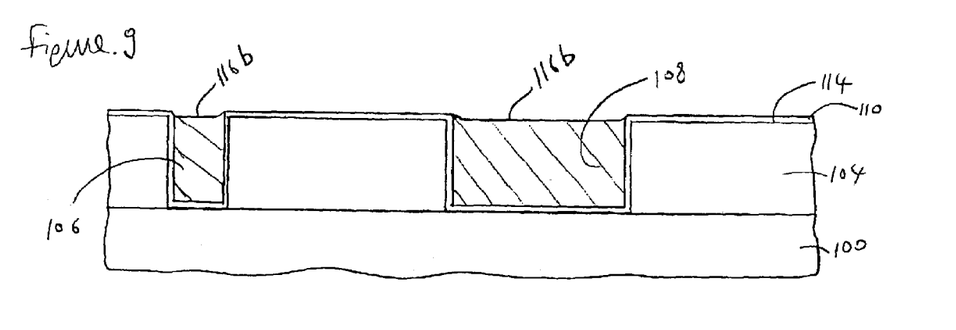

FIGS. 8 and 9 illustrate a transition stage before the electroetching process that may be terminated in a self-limiting fashion. Referring to FIG. 8, as the electroetching process continues, the planar conductive layer 102a is removed from the top of the field regions 114 which are coated with the barrier layer 110. Therefore, in an instant of the process, a copper surface 116a of the copper layer becomes coplanar with the surface of the barrier layer 110 when the barrier layer is exposed. At this stage, the solution wiper can still sweep the surface 116a and the barrier layer and cause further etching of the surface 116a. As shown in FIG. 9, if the sweeping action is continued, an over etch of the conductive layer portions in the features 106, 108 may occur before the etching terminates. However, as soon as the over etching happens the high resistance solution fills the over etched surfaces and does not allow further electroetching to occur. Even if the solution wiper is moved and the process continued, it only sweeps the surface of the barrier layer 110 that cannot be etched with the electroetching solution of the process. Since, the features of the solution wiper cannot also sag into the over etched surfaces 116b, the high resistance solution further protects the over etched surfaces 116b and prevents them from being etched. In one example, the over etching depth may be given in the range of the thickness of the barrier layer which is 100 to 300 Angstroms. Accordingly, the etching process advantageously self terminates without needing any endpoint detection system. However, if the process is ran in a constant current mode, an increased voltage may indicate the endpoint of the copper removal. Also, if the process is run in a constant voltage mode, a decreased current value may indicate the end point where the barrier layer on the field regions is exposed.

Figure 10:
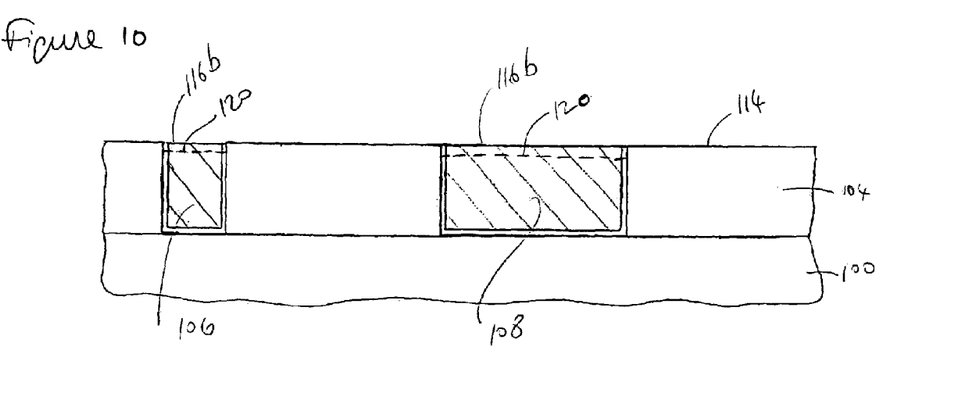

As shown in FIG. 10, if the copper is minimally over-etched as shown in FIG. 9, over etched copper is advantageously leveled with the field regions 114 after the removal of the barrier layer 110. During the barrier layer removal, the copper electroetching solution may be replaced with a specific electroetching solution that etches the barrier layer but not the copper layer. Even if the etching solution has capability to etch both barrier and copper layers, the method of the present invention would still arrest over etching of copper within the features. For example a non-selective solution chemistry that electroetches both the copper and the barrier material may be used. In this case, over etch line 120 (dotted lines in FIG. 10) show the extend of over etch within the features 106, 108. As shown in FIG. 10 once as the electroetching removes the cooper and the barrier layer until the over etch line 120 with a non-selective chemistry solution, the electroetching process stops at the insulator layer. Removal of the barrier layer may also be performed using CMP process. Alternately it is possible to remove the barrier layer with a dry etch process such as reactive ion etch process.

It should be noted that the present invention would result in the structure of FIG. 9 even if it initially (after the planarization step) had given the structures of FIG. 2A or FIG. 2C instead of the uniform-thickness structure shown in FIG. 7. The reason is the self-limiting nature of the process that does not allow excessive dishing into the features.

In an alternative embodiment the arrangement of the phases in the process environment can be reversed such that the electroetching solution can be the denser phase and the high resistance solution can be the lighter phase. In such case, a system having the wafer-up position is used such that the lighter high resistance solution always covers the wafer surface by floating on the electroetching solution.

Figure 11:
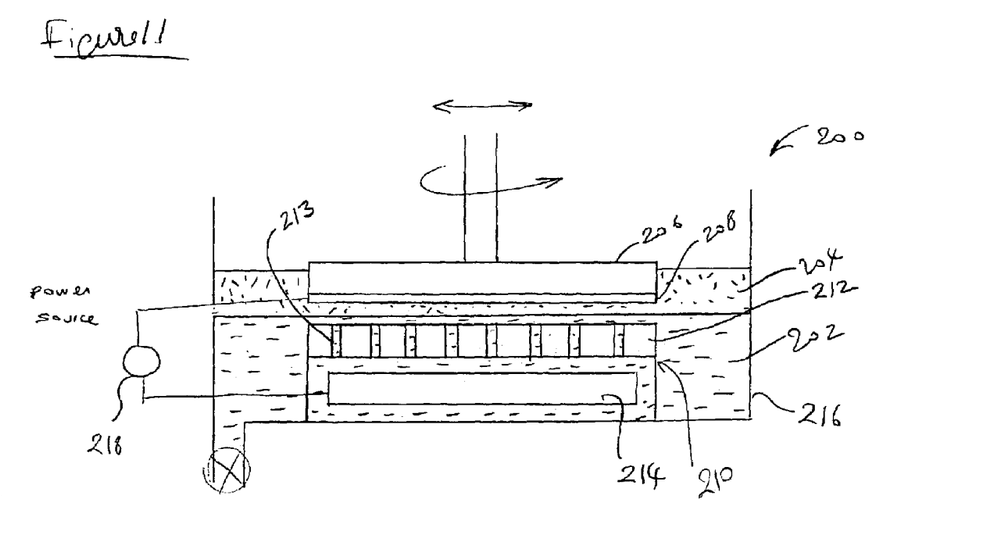
FIG. 11 is a schematic illustration of another exemplary multiphase etching system of the present invention.

FIG. 11 shows an electroetching system 200 having a wafer-up configuration. The system 200 uses an alternative dual phase solution comprising an electroetching solution 202 and a high resistance solution 204. However, the high resistance solution in this embodiment is lighter than the electroetching solution. Consequently, the high resistance solution floats on the electroetching solution 202 during the process and covers the wafer surface that is being processed. A workpiece carrier 206, holding a wafer 208, of the system 200 is moved in the high resistance solution 204. A solution wiper assembly 210 having a solution wiper 212 and an electrode 214 is placed in a system container 216. The solution wiper 212 may have a plurality of openings 213 or pores allowing electroetching solution 202 to wet the electrode 214. The solution wiper assembly 210 is kept in the electroetching solution 202. The electrode 214 and the wafer are connected to a power supply 218 to apply a voltage difference between the electrode and the copper coated surface of the wafer during the electroetching process. The process is performed in a similar manner described for the above system. This process can also be performed as a chemical etching process, without connecting the system to a power supply and replacing electroetching solution with a conventional copper etching solution.

Yet in another embodiment, the high resistance phase of the dual phase process environment may preferably be comprised of solid particles and a solution surrounding such particles. The second phase of the dual phase process environment comprises the process solution phase. The solution surrounding the particles may be the same as the process solution, or it may be another solution that does not dissolve in or mix with the process solution. As in the previous embodiment, process of the present embodiment can be also performed without using a potential difference between the electrode and the copper coated wafer surface if the process solution is an etching solution rather than an electroetching solution. In this case, the high resistance phase may be changed with an etch resistant or resistant phase. In other words, in this case, this phase does not have to be electrically high resistance but it has to be chemically resistant to form a barrier to etching of the wafer surface by the etching solution.

Figure 12:
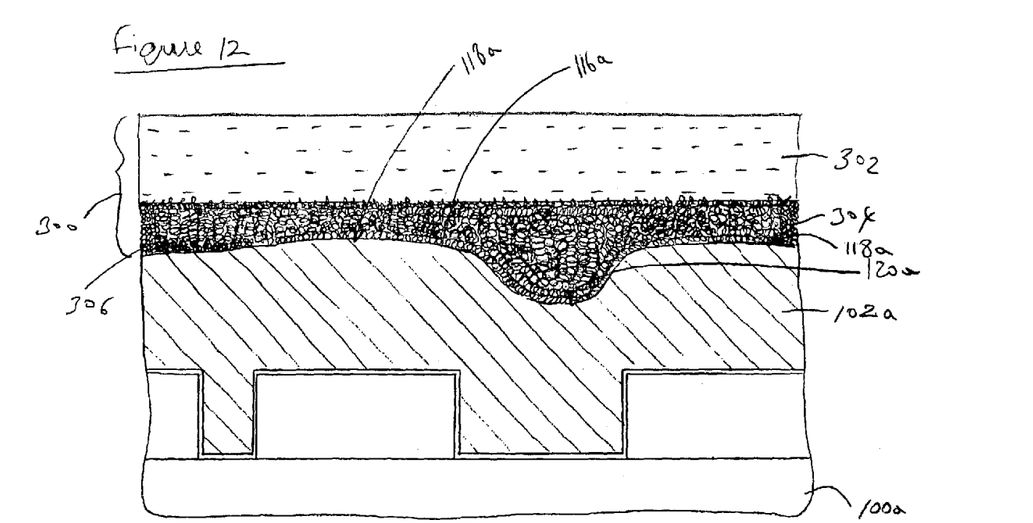
FIG. 12 is a schematic illustration of a wafer surface, wherein the surface has been immersed in the dual phase etching environment of the system shown in FIG. 12.

FIG. 12 illustrates a portion of a wafer 100a, which is immersed in the dual phase process environment 300. The surface 116a of the copper layer 102a has raised and recessed regions 118a, 120a. The dual phase process environment of the present invention comprises a process solution phase 302 and a near-surface phase 304. The process solution phase 302 is an electroetching solution such as phosphoric acid as in the previous case. However, in this embodiment, the near-surface phase 304 is comprised of a mixture of solid particles 306 that cover the surface of the copper layer 102a and liquid electroetching solution 302. The particles 306 may be less than 500 Angstrom (Å) in size and preferably less than 100 Å. Various material powders may be used as the particle material. Materials that are stable in the process solution phase 302 are preferred. Materials with high resistance such as zirconia, alumina, ceria, and high-density polymers may be used as the powder material.

Figure 13:
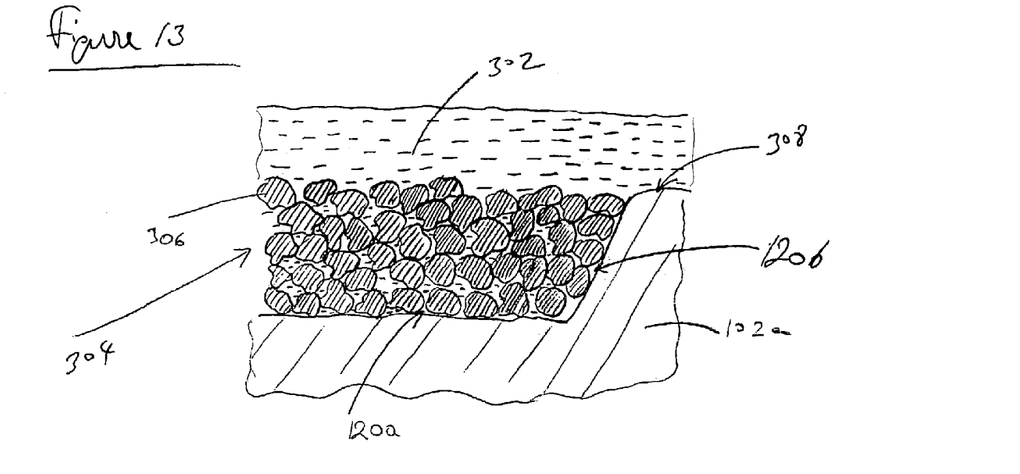
FIG. 13 is a detail schematic illustration of a recessed region of the surface shown in FIG. 12, wherein the recessed region has been filled with high resistivity phase.

FIG. 13 simply shows the functionality of the near-surface phase 304 with respect to electroetching solution 302 and the copper layer 102a, and for the purpose of clarification, it is highly exaggerated. As exemplified in FIG. 13, the space between the particles 306 is filled with the electroetching solution 302. If the particles are made of highly resistive materials, they form a high resistance layer over the copper layer 102a, which layer substantially limits the applied current flow between the copper layer 102a and the electrode of the system (see FIG. 3A). For example, referring to FIG. 13, the resistance to current flow in an exposed region 308 of the copper layer 102a, is much less than the resistance to current flow in a valley region 120 or a slope region 120a of the copper layer due to the thickness of the near-surface phase 304 on such regions 120a and 120b.

Figure 14:
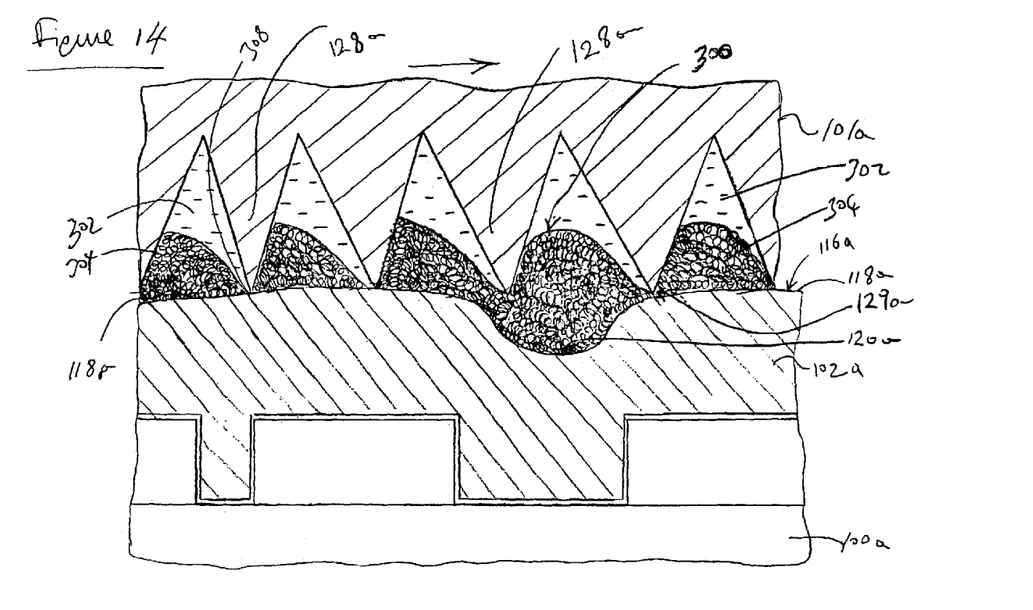
FIG. 14 is a schematic illustration of wafer surface shown in FIG. 12, wherein the surface has been electropolished in the dual phase environment and using a mechanical disturbance.
Figure 15:
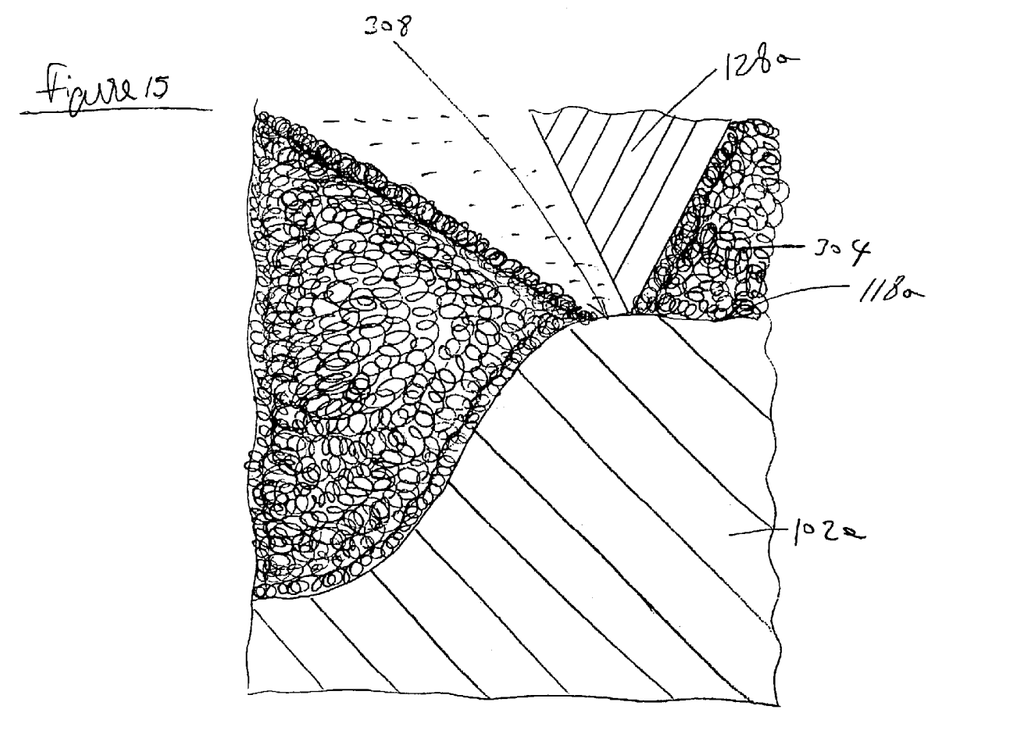
FIG. 15 is a detailed schematic illustration of the surface and the mechanical disturbance on the surface shown in FIG. 13.

In operation, as shown in FIG. 14 and in detail FIG. 15, exposed areas 308 on the copper layer 102a can be created instantaneously with the mechanical action of a solution wiper 101a that one example of it is described above. As features 128a of the wiper 101a expose the exposed regions 308 on the raised regions 118a, the etching solution 302 attacks the exposed regions 308 and electroetches them. Meanwhile, due to the high electrical resistance in the valleys 120a and the slopes 120b, a limited material removal occurs in such areas, resulting in planarization. If process is continued, structures in FIGS. 7, 8, 9 and 10 are obtained as described previously in relation with the above embodiment using high resistance solution phase.

The use of wiper or wipers in embodiments described previously helps etching of the top portions of the copper layer by exposing these portions to the etching or electroetching solution. Wiper 101a also helps removal of etching by-products from the surface and exposing fresh surface for further removal. It helps mass transfer and brings fresh solution to the surface to be etched.

Alternatively, the dual phase process environment 300 of FIG. 12 may also be used without the wiper. In this case the particles in near-surface phase 304 are surrounded by the electroetching solution 302 and the top of the near-surface phase 304 is substantially parallel to the top surface of the wafer 100a. An electroetching potential is applied between an electrode (not shown) in contact with the electroetching solution 302 and the copper layer 102a making the copper layer anodic. Copper starts to dissolve but since the near-surface phase is thicker over the valley 120a or recess in the copper layer 102a, the resistance to current flow is higher and less electroetching current density passes through that region compared to the higher regions. This automatically starts to planarize the copper layer. As planarization occurs and the copper surface moves down, particles 306 sink down with the copper surface. For this technique to be successful, the size of the particles must be much smaller than the depth of the valleys. Considering the fact that in standard electroplating technique, valley depths in the range of 2000–30000 Å may need to be planarized, a particle size of less than 100 Å is preferred. Since the solution phase surrounding sub-micron particles is expected to be highly resistant to current flow, small increase of the thickness of near-surface phase 304 can induce large resistance changes.

Although the preferred particle material is made of an inert high-resistance material, conducting powders or conducting powders covered with insulators may also be used in the near-surface phase of this invention. If conductive powders are used, when anodic voltage is applied to the copper surface this voltage would also be communicated to the top surface of the near surface phase. Therefore, electroetching current would want to pass and anodize the conductive material of the particles. If the particles are made of materials such as Ti, Al and Ta, an anodic oxide would grow on the particle surfaces making them electrochemically inactive, and the process would continue as described previously in the case of high-resistivity or insulating particles. Another approach involves selection of a conductive material that is highly stable in the solution but does not form a high resistance oxide upon application of voltage. In this case oxygen may be generated on the surface of such particle materials, however, during the process etching of copper would be preferred since it requires lower voltage. As the sweeper moves and exposes the copper surface, electroetching still continues at the raised regions of the copper surface as described previously.

In yet another approach particles in near-surface phase may include magnetic particles that are coated with insulators. In such applications core of the particle may be a magnetic material such as cobalt or cobalt alloys. In this approach, once the near surface phase is disposed on the copper layer to be processed, a magnetic field is applied through the backside of the wafer (the side that does not have the copper layer) so as to magnetically attract the particles to the copper surface. After the mechanical action, near-surface phase comprising the magnetic particles quickly forms on the copper surface and prevents electro etching of the copper in the recessed regions. A magnetic field source may be a magnetic film attached or coated to the backside of the wafer.

One other factor that contributes to the planarization capability of the present invention is the fact that use of electroetching solution such as phosphoric acid itself as part of the near surface phase which also includes high resistance particulates. During the process, when a voltage is first applied to the copper layer concentration of the copper and acid species in the adjacent solution is increased. In this respect, a concentration gradient including such species is established over the copper layer. Acid species from the bulk electroetching solution and copper ions leaving the surface have to diffuse through this surface layer. This surface layer forms overt the entire topography of the copper layer. Due to the concentrated ions and the adjacent high resistivity pariculates in this region, diffusion of ions through the surface layer from either direction is difficult and consequently, etching rate is significantly reduced after the formation of the surface layer. However, as described above use of a mechanical action disturbs the surface layer coating the raised regions and allows bulk electroetching solution to contact the surface of raised regions and electroetch them, while the surface layer in the recessed regions left undisturbed thereby inhibiting electroetching in the valleys.

In the case of a process solution comprising an etching solution rather than electroetching solution, the only condition for the material of the powder is that it should be stable in the etching solution. Its conductivity does not play any role in the process.

It should be understood, of course, that the foregoing relates to preferred embodiments of the invention and that modifications may be made without departing from the spirit and scope of the invention.

What is claimed is:

1. An etching process to remove material from a wafer having a top surface using a multiphase environment, the process comprising:
   providing a fluid multiphase environment, including a fluid etchant phase over a fluid resistant phase and a phase interface therebetween:
   immersing the top surface into the resistant phase of the multiphase environment, the resistant phase covering the top surface, wherein the top surface is disposed adjacent the phase interface between the resistant phase and the etchant phase;
   disturbing the top surface to move the resistant phase from the top surface to enable the etchant phase to contact the top surface; and
   etching the top surface.

2. The etching process of claim 1, wherein disturbing the top surface includes mechanically disturbing the top surface.

3. The etching process of claim 2, wherein mechanically disturbing the top surface includes sweeping the top surface.

4. The etching process of claim 1, wherein the top surface of the wafer includes a conductive surface with recessed and raised regions and wherein disturbing includes moving the resistant phase from the raised regions of the conductive surface to enable the etchant phase to contact the raised regions.

5. The etching process of claim 4, further comprising electroetching the raised regions.

6. The etching process of claim 4, wherein disturbing does not substantially move the resistant phase filling the recessed regions.

7. The process of claim 6, wherein the resistant phase inhibits etching of the recessed regions thereby causing planarization of the top surface.

8. The etching process of claim 1, wherein the fluid resistant phase comprises a liquid.

9. The etching process of claim 8, wherein the fluid resistant phase is denser than the fluid etchant phase.

10. The etching process of claim 1, wherein the fluid etchant phase is denser than the fluid resistant phase.

11. The etching process of claim 1, wherein the fluid resistant phase comprises a plurality of solid particles and a solution surrounding the plurality of particles.

12. The etching process of claim 1, wherein the fluid resistant phase is denser than the fluid etchant phase.

13. The etching process of claim 11, wherein the fluid etchant phase is denser than the fluid resistant phase.

14. The process of claim 11, wherein the solution surrounding the plurality of particles comprises the same fluid as the fluid etchant phase.

15. The process of claim 11, wherein the solution surrounding the plurality of particles comprises a different fluid than the fluid etchant phase.

16. A material removal process using a multiphase environment for operating upon a conductive surface having recessed and raised regions, the conductive surface being formed a wafer with cavities, wherein the surface of the wafer and the cavities are lined with a barrier layer, the process comprising:
   providing a fluid multiphase environment, including a fluid etchant phase over a fluid etch-resistant phase and a phase interface therebetween
   immersing the conductive surface into the etch-resistant phase of the multiphase environment such that the conductive surface is disposed adjacent the phase interface between the etch-resistant phase and the etchant phase, the etch-resistant phase covering the conductive surface; and
   applying a surface disturbance to the conductive surface, the surface disturbance moving the etch-resistant phase from the raised regions of the conductive surface and enabling the etchant phase to contact and etch the raised regions.

17. The process of claim 16, wherein the surface disturbance does not move the etch-resistant phase filling the recessed regions.

18. The process of claim 17, wherein the etch-resistant phase inhibits etching of the recessed regions.

19. The process of claim 16, wherein the surface disturbance includes a mechanical disturbance.

20. The process of claim 16, wherein the mechanical disturbance includes sweeping the conductive surface with a sweeper.

21. The process of claim 16, wherein the surface disturbance is applied until the raised regions are etched uniformly.

22. The process of claim 21, wherein the surface disturbance is applied until the conductive surface is etched down to the barrier layer to form planarized conductive deposits in the cavities.

23. The process of claim 22, further comprising etching the barrier layer on the surface of the wafer.

24. The process of claim 21, wherein the surface disturbance is applied until the conductive surface and the barrier layer on the surface of the wafer are etched to form planarized conductive deposits in the cavities.

25. The process of claim 16, wherein the etchant phase includes an electropolishing solution.

26. The process of claim 25, further comprising maintaining a potential difference between the conductive surface and an electrode contacting the electropolishing solution.

27. The process of claim 16, wherein the etchant phase includes a chemical etchant solution.

28. The process of claim 16, wherein the conductive surface includes copper.

29. The process of claim 16, wherein the fluid etch-resistant phase comprises a liquid.

30. The etching process of claim 29, wherein the fluid etch-resistant phase is denser than the fluid etchant phase.

31. The etching process of claim 29, wherein the fluid etchant phase is denser than the fluid etch-resistant phase.

32. The etching process of claim 16, wherein the fluid etch-resistant phase comprises a plurality of solid particles and a solution surrounding the plurality of particles.

33. The etching process of claim 32, wherein the fluid etch-resistant phase is denser than the fluid etchant phase.

34. The etching process of claim 32, wherein the fluid etchant phase is denser than the fluid etch-resistant phase.

35. The process of claim 32, wherein the solution surrounding the plurality of particles comprises the same fluid as the fluid etchant phase.

36. The process of claim 32, wherein the solution surrounding the plurality of particles comprises a different fluid than the fluid etchant phase.

* * * * *

UNITED STATES PATENT AND TRADEMARK OFFICE
CERTIFICATE OF CORRECTION

| | |
|---|---|
| PATENT NO. | : 7,101,471 B2 |
| APPLICATION NO. | : 10/383466 |
| DATED | : September 5, 2006 |
| INVENTOR(S) | : Erol C. Basol |

It is certified that error appears in the above-identified patent and that said Letters Patent is hereby corrected as shown below:

On the Title Page at Item (57) Abstract, Column 2, Line 13, delete "rescessed" and insert --recessed--, therefor.

At Column 1, Line 8 (approx.), after "60/362,513" insert --,--.

At Column 3, Line 36, delete "a" and insert --an--, therefor.

At Column 3, Line 41 (approx.), delete "eletopolished," and insert --electropolished,--, therefor.

At Column 3, Line 41 (approx.), delete "eletorpolishing" and insert --electropolishing--, therefor.

At Column 3, Line 48, delete "non uniform" and insert --non-uniform--, therefor.

At Column 3, Lines 58-59, after "thickness" insert --;--.

At Column 4, Line 2, delete "non uniform" and insert --non-uniform--, therefor.

At Column 7, Line 18 (approx.), delete "instanteniously" and insert --instantaneously--, therefor.

At Column 7, Line 25, delete "becontacted" and insert --be contacted--, therefor.

At Column 7, Line 59 (approx.), delete "ran" and insert --run--, therefor.

At Column 8, Line 66, delete "etch resistant" and insert --etch-resistant--, therefor.

At Column 10, Line 57 (approx.), delete "pariculates" and insert --particulates--, therefor.

At Column 11, Line 14, in Claim 1, delete "therebetween:" and insert --therebetween;--, therefor.

At Column 11, Line 46 (approx.), in Claim 10, delete "claim 1," and insert --claim 8,--, therefor.

At Column 11, Line 51 (approx.), in Claim 12, delete "claim 1," and insert --claim 11,--, therefor.

Signed and Sealed this
Fifth Day of July, 2011

David J. Kappos
*Director of the United States Patent and Trademark Office*

At Column 11, Line 65, in Claim 16, after "formed" insert --on--.

At Column 12, Line 3, in Claim 16, after "therebetween" insert --;--.